United States Patent [19]

Wood

[11] Patent Number: 4,675,552

[45] Date of Patent: Jun. 23, 1987

[54] SINGLE INPUT/MULTIPLE OUTPUT LOGIC INTERFACE CIRCUIT HAVING MINIMIZED VOLTAGE SWING

[75] Inventor: Grady M. Wood, Melbourne, Fla.

[73] Assignee: Harris Corporation, Melbourne, Fla.

[21] Appl. No.: 699,686

[22] Filed: Feb. 11, 1985

[51] Int. Cl.[4] .......................................... H03R 19/013
[52] U.S. Cl. .................................... 307/454; 307/443; 307/475; 307/549; 307/264
[58] Field of Search .................. 307/200 A, 443, 446, 307/454, 456, 475, 542, 544, 549, 559, 564, 254, 296 R, 297, 299 A, 264

[56] References Cited

U.S. PATENT DOCUMENTS

| | | |
|---|---|---|
| 3,808,457 | 4/1974 | Filippov et al. ............... 307/456 |
| 3,999,080 | 12/1976 | Weathersby, Jr. et al. ........ 307/456 |
| 4,228,371 | 10/1980 | Mazgy ..................... 307/254 X |
| 4,234,803 | 11/1980 | Nonaka ................... 307/299 A |
| 4,331,887 | 5/1982 | Jadus et al. ............. 307/296 R X |
| 4,400,635 | 8/1983 | Mazgy ..................... 307/254 X |
| 4,518,876 | 5/1985 | Constantinescu ............. 307/475 |
| 4,581,550 | 4/1986 | Ferris et al. ............. 307/456 X |

Primary Examiner—Stanley D. Miller
Assistant Examiner—D. R. Hudspeth
Attorney, Agent, or Firm—Antonelli, Terry & Wands

[57] ABSTRACT

A single input/multiple output NOR gate employs a reference voltage source for establishing the operational level of a multiple output current logic driver transistor. As the reference voltage source, the forward base-emitter voltage $V_{be}$ of a second transistor is used. Coupled between the current logic driver transistor and the second transistor is a multiple emitter diode-connected input transistor. One of the emitters of the input transistor is coupled in the current flow path from the current logic driver transistor to a current control resistor that is coupled in parallel with the base-emitter junction of the reference transistor, while a second emitter of the input transistor is coupled to the collector-emitter current flow path of the second (reference) transistor.

In the absence of the application of current to the input transistor, the voltage level at the input is effectively equal to the sum of the forward base-emitter voltage drops of the input and second transistors. In response to the application of current to the input transistor excess input current is diverted via the second emitter of the multiple emitter input transistor and the collector-emitter path of the second transistor. Yet, because the voltage level at the input remains defined in accordance with the sum of the base-emitter voltage ($V_{be}$) drops across the series connection of the base-emitter junctions of the input and second transistors, the voltage level at the input is substantially unchanged (or minimized).

50 Claims, 5 Drawing Figures

SINGLE INPUT/MULTIPLE OUTPUT LOGIC INTERFACE CIRCUIT HAVING MINIMIZED VOLTAGE SWING

FIELD OF THE INVENTION

The present invention relates to digital logic circuits, and is particularly directed to an improved NOR gate (multiple fan-out inverter) configuration that is capable of effectively minimizing voltage swings on gate interconnection links, thereby significantly increasing the speed of operation of the logic.

BACKGROUND OF THE INVENTION

Over the years improvements in the design and operation of signal processing components, such as digital bipolar logic circuits, have provided increased speed and reduced power consumption. From the early days of DTL and T²L devices, bipolar logic has expanded to include ECL, I²L, ISL and STL circuits. Because these newer types of logic operate with smaller voltage swings (typically in the 200 mv to 800 mv range, as contrasted with the 1.5 v to 2.0 v swings for older DTL and T²L circuits) the time required to charge and discharge the inherent (parasitic) capacitance of the logic gate interconnect links (metalization tracks) is reduced and, consequently, there is obtained an increase in operating speed.

More particularly, associated with each conductor which interconnects logic circuit devices that are contained within an integrated circuit is an inherent parasitic capacitance which must be charged and discharged in the course of switching from one logic state to another. The time T required to produce the voltage swing between the two charge states of the parasitic capacitance of the gate interconnect can be expressed as T=CV/I, where C is the parasitic capacitance of the gate interconnection link, V is the voltage swing on the link, and I is the current flow.

From this relationship it can be seen that reductions in voltage swing on the interconnects increase the speed of operation of the logic. However, the degree to which the logic circuit is capable of reducing these voltage swings depends upon trade offs in noise margin and internal ground line drops.

SUMMARY OF THE INVENTION

In accordance with the present invention there is provided a new and improved logic gate, specifically a single input/multiple output NOR gate, that is capable of effectively minimizing the magnitude of the voltage swing on logic gate interconnection links, through the use of current mode techniques for defining the operation of the gate. As a result, the present invention offers an operating speed that is faster than that of the prior art while, at the same time, circumvents the above-mentioned voltage swing/noise margin-ground drop trade off, in that the immunity to ground line drops is maintained greater than the logic level swing, and the input impedance is low, increasing noise immunity.

For this purpose the NOR gate of the present invention employs a reference voltage source for establishing the operational level of a multiple output current logic driver transistor. As the reference voltage source, the forward base-emitter voltages ($V_{be}$)s of a reference transistor and an input transistor are used. The input transistor is coupled between the current logic driver transistor and the second transistor as a multiple emitter diode-connected input transistor. One of the emitters of the input transistor is coupled in the current flow path from the current logic driver transistor to a current control resistor that is coupled in parallel with the base-emitter junction of the reference transistor, while a second emitter of the input transistor is coupled to the collector-emitter current flow path of the second (reference) transistor. Thus, from the diode-tied base-collector connection of the input transistor, to which input logic currents are applied, to a reference voltage (ground) there is effectively provided a series connection through the base-first emitter junction of the input transistor and the base-emitter junction of the second transistor.

In the absence of the application of current to the input transistor (i.e. a first prescribed logic level current from a logic gate interconnect link), the voltage level at the input (and therefore on the gate interconnect to which that input is coupled) is effectively equal to the sum of the forward base emitter voltage drops of the input and reference transistors. In response to the application of substantial (high) current to the input transistor (representative of a second prescribed logic level) which exceeds the magnitude of the current in a flow path from the first emitter of the input transistor through the current control resistor of the reference voltage source, the excess input current is diverted via the second emitter of the multiple emitter input transistor and the collector-emitter path of the second (reference) transistor. Yet, because the voltage level at the input remains defined in accordance with the sum of the base-emitter voltage ($V_{be}$) drops across the series connection of the base-emitter junctions of the input and reference transistors, the voltage level at the input is substantially unchanged (or minimized). By "minimized" (or substantially unchanged) is meant that any change in $V_{be}$ (as governed by the (logarithmic) relationship between $V_{be}$ and emitter current) is extremely small (on the order of 20 mv).

To prevent a substantial voltage swing at the base of the output driver transistor upon the application of input current to the input transistor as described above, a series connection of a voltage dropping diode and a fourth transistor is provided between the base of the output driver transistor and the collector of the second (reference) transistor. A further control resistor is provided between the base and collector of the fourth transistor to establish the nominal voltage level of the output driver transistor at the sum of the voltage drops of the effective series connection of the base-emitter junctions of the driver, input and reference transistors (or 3 $V_{be}$) minus the drop across a voltage divider resistor. In the absence of a current input to the input transistor, the base voltage of the output driver transistor is equal to the sum of these base-emitter voltages plus the drop through an output resistor in the emitter current flow path of the driver transistor. In response to a substantial current input, as described above, the base voltage of the driver transistor drops by an amount governed by the control resistor which forms part of a voltage divider between the supply voltage and the collector of the fourth transistor.

DETAILED DESCRIPTION

Figure 1:
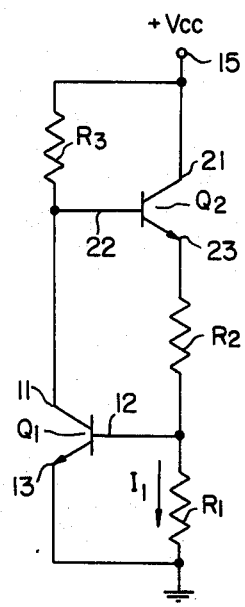
FIG. 1 is a schematic diagram of voltage reference source.

In order to facilitate an understanding of the configuration and operating principles of the improved NOR gate of the present invention, the invention will be described in terms of a fundamental building block, followed by a description of modifications and additions to that building block which result in the improved configuration of the gate. Referring now to FIG. 1, there is shown a schematic circuit diagram of a voltage reference source that may be considered to be a fundamental starting circuit for the eventual NOR gate configuration of the invention. The voltage reference source comprises a reference transistor Q1 and an output-driver transistor Q2. Each of transistors Q1 and Q2 is illustrated as an NPN bipolar transistor coupled between a positive supply voltage +VCC terminal 15 and ground. (Obviously, for PNP transistors, there is a corresponding change in bias voltage polarity.) The emitter 13 of transistor Q1 is coupled to a reference voltage level (ground, as shown) and its collector 11 is coupled to the base 22 of transistor Q2 and one end of a bias resistor R3. The other end of bias resistor R3 is coupled to power source (+$V_{CC}$) terminal 15. Also coupled to bias supply terminal 15 is the collector 21 of transistor Q2, the emitter 23 of which is coupled to one end of a resistor R2, the other end of which is coupled to the base 12 of a transistor Q1. The base 12 of transistor Q1 is also coupled through a control resistor R1 to ground.

The circuit configuration of FIG. 1, including the reference voltage transistor Q1 and the output (inverter) transistor Q2, operates as follows. With resistor R1 being coupled across the base-emitter junction of transistor Q1, then the current I1 flowing through resistor R1 is equal to $V_{be(Q1)}/R1$. Assuming that transistor Q1 has a high $H_{fe}$, then approximately the same current I1 flows through resistor R2. As a result, the voltage $V_{23}$ at the emitter 23 of transistor Q2 is equal to $V_{be(Q1)}[1+R2/R1]$. Therefore, the voltage $V_{22}$ at the base 22 of transistor Q2 is equal to $V_{be(Q2)}+V_{23}$, i.e. $V_{22}=V_{be(Q1)}[1+R2/R1]+V_{be(Q2)}$.

Figure 2:
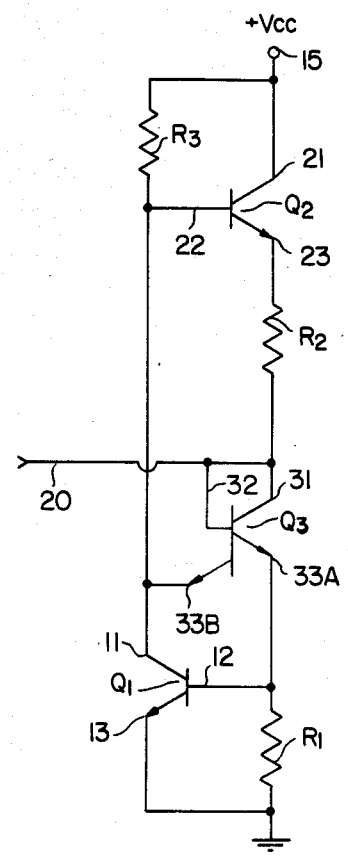
FIG. 2 shows a modification of the circuit of FIG. 1 incorporating a multiple emitter input transistor.

Referring now to FIG. 2, there is shown a modification of the circuit configuration of FIG. 1, wherein an input transistor Q3 is coupled between output driver transistor Q2 and reference voltage transistor Q1. More specifically, input transistor Q3 has its base and collector connected in common to form a diode-connected transistor, the base 32 and collector 31 being coupled to one end of resistor R2 and to an input line 20. A first emitter 33A of transistor Q3 is connected to the base 12 of transistor Q1 and resistor R1. A second base 33B of transistor Q3 is connected to the collector 11 of transistor Q1. With this configuration, the potential on line 20, relative to a reference potential (ground), is defined by the forward base-emitter voltage of transistor Q1 ($V_{be(Q1)}$) and the forward base-emitter voltage between emitter 33A and base 32 of transistor Q3 ($V_{be(Q3)}$). (Although transistor Q3 is shown as a multiple emitter transistor, it may equally be configured as separate diode-connected transistors with separate emitter paths corresponding to emitters 33A and 33B as shown in the Figure. A multiple emitter transistor is preferable because the transistor occupies less space on an integrated circuit chip.)

Considering now the operation of the configuration shown in FIG. 2, when no current is applied to input line 20 (corresponding to a first prescribed logic state of the input) the voltage $V_{31}$ at the collector of transistor Q3 is, as mentioned above, equal to $V_{be(Q1)}+V_{be(Q3)}$. At this time, the current flowing through transistor Q3 flows through emitter 33A to the resistor R1 and is approximately equal to $V_{be(Q1)}/R1$. In this condition, the current flowing through the collector-emitter path of transistor Q3 and resistor R1 is also the same current flowing through resistor R2 from the emitter of transistor Q1. Namely, the base-collector connection of transistor Q3 may be considered to be a current reference node to which the input line 20 is connected.

For a change in logic signal level, whereby current is forced through input line 20 to the node of the collector 31 of transistor Q3, the current flowing through the emitter 33A of transistor Q3 will remain the same, whereas there will be a decrease in the current flowing through resistor R2. As the input current continues to increase, and eventually exceeds the current flowing through the emitter 33A of transistor Q3 through resistor R1 (or exceeds $V_{be(Q1)}/R1$), then the voltage level at the collector 11 of transistor Q1 will drop, to sink excess current through the emitter 33B of transistor Q3. Namely, as mentioned above, the current through the emitter 33A of transistor Q3 does not appreciably change.

Because the potential on line 20 at the collector node of transistor Q3 is governed by the sum of the forward base-emitter voltage drops of transistors Q1 and Q3 (which are effectively connected in series between ground and line 20), it can be seen that even though there has been a substantial change in current applied to line 20, the voltage level on line 20 does not substantially change. It is this ability of the circuit to effectively maintain the same voltage level irrespective of change in input current on the input line, and thereby also on the gate interconnect links that are connected to the input line, that affords the substantial increase in speed in the operation of the logic circuitry which incorporates the present invention.

In actuality, the voltage differential on line 20 between a first logic state (no input current applied) and a second logic state (substantial input current applied) is not exactly zero, because of the logarithmic characteristic between the emitter current of the transistors and the base-emitter voltage ($V_{be}$). More specifically, as the voltage at the collector 11 of transistor Q1 drops, so as to divert excess current through the emitter 33B of transistor Q3 in response to the application of a substantial logic level current input on line 20, there is an increase in current flow through the emitter 13 of transistor Q1. This increase in current flow through the emitter of transistor Q1 causes a slight (logarithmicly defined) increase in $V_{be(Q1)}$. For present day circuits, this is on the order of approximately 60 mv/decade. Thus, the voltage swing on line 20 can be held to approximately 20 mv, at low bias current settings which is approximately an order of magnitude less than voltage swings of the 200 mv to 800 mv excursions experienced by prior art devices, including improved ECL, I²L, ISL and TSL circuits.

Figure 3:
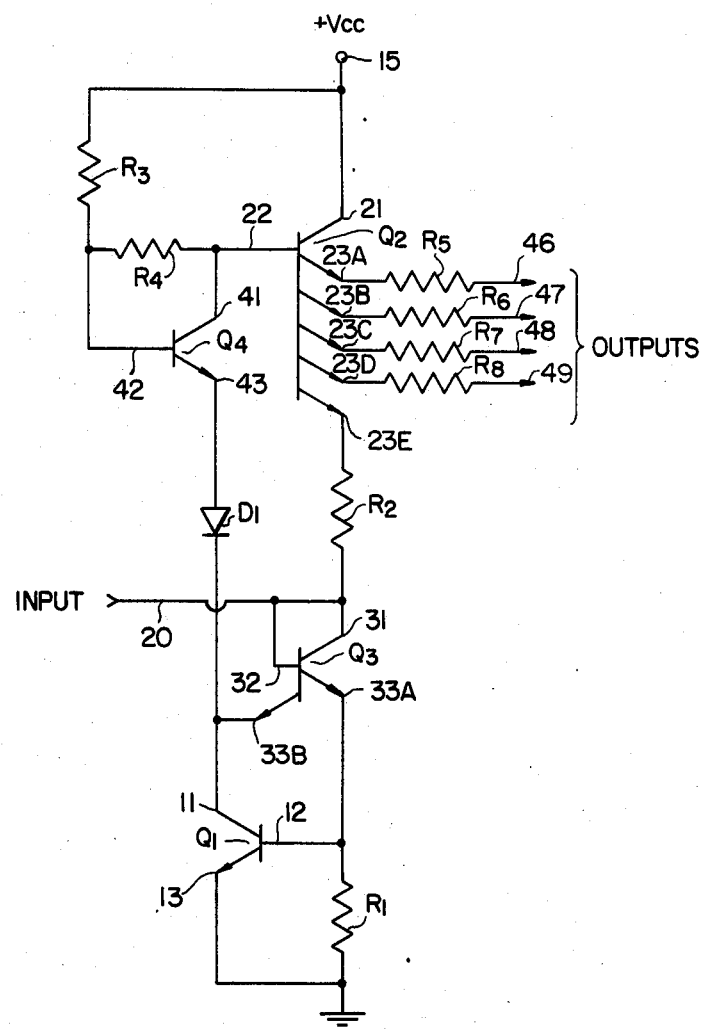
FIG. 3 is a schematic diagram of a single input/multiple output NOR gate in accordance with an embodiment of the present invention.

Referring now to FIG. 3, a complete configuration of an embodiment of the single input/multiple output NOR gate of the present invention is shown. In FIG. 3, transistor Q2 is shown as a multiple emitter (output) driver transistor having emitters 23A-23E. To emitters 23A-23D are coupled respective resistors R5-R8 for providing appropriate current levels on output lines 46-49.

In the operation of the circuit shown in FIG. 2, for the application of a substantial input current on line 20, the base 22 of transistor Q2 undergoes a substantial internal voltage swing. To compensate for this swing, the embodiment of FIG. 3 employs a voltage dropping diode D1 and a voltage dropping transistor Q4. Transistor Q4 has its collector 41 connected to the base 22 of transistor Q2, while its emitter 43 is coupled to the anode of diode D1, the cathode of which is coupled to collector 11 of transistor Q1. Between the base 42 and collector 41 of transistor Q4 is a control resistor R4 which forms, together with resistor R3, a voltage divider for establishing a prescribed voltage drop across resistor R4 of approximately 100 mv and setting the nominal operating point of the base 22 of transistor Q2 at approximately 3 $V_{be}$. Namely, for small input currents, the voltage level at the base 22 of transistor Q2 is equal to the sum of the forward base-emitter voltage drops of transistors Q1 and Q3 connected in series, as noted above in connection with the description of FIG. 2, together with the voltage drop across resistor R2, ($V_{be} \cdot R2/R1$). Namely, when no current is applied to input line 20, the base 22 of transistor Q2 has a voltage level above 3 $V_{be}$ by an amount $V_{be} \cdot R2/R1$.

In response to the application of a substantial current in excess of $V_{be}/R1$ to line 20, as mentioned above in connection with the description of the operation of FIG. 2, the voltage level on the base 22 of transistor Q2 drops. However, it drops by an amount governed by the dropping resistor R4 and the voltage at the base 42 of transistor Q4. Namely, the controlled diode action of transistor Q4 and the diode drop across diode D1 reduces the voltage on the base 22 of transistor Q2 by an amount approximately equal to $$V_{be(Q1)}R2/R1 + \frac{(V_{cc} - V_{be(Q1)} - V_{DD} - V_{be(Q4)})(R4)}{R3 + R4}.$$

R3 and R4 are adjusted, so that there are approximately equal positive and negative voltage excursions for the respective logic states about a nominal operating level of 3 $V_{be}$ at the base of transistor Q2.

The operating current for the configuration shown in FIG. 3 is determined by the values of resistors R1 and R3. As pointed out above, resistor R4 is adjusted to provide approximately 100 mv internal drop for a high input current applied to input lead 20. The value of resistor of R4 may be approximately determined by the relationship R4=(0.1R3)/($V_{cc}-V_{be}$). Resistor R2 is adjusted to provide a drop of approximately 100 mv for no current applied to input line 20. Resistor R2 has a value approximately determined by the relationship R2=(0.1R1)/$V_{be(Q1)}$. Output current control resistors Q5-Q8 are set approximately equal to R2/2.

Because the internal voltage drop of the circuit of FIG. 3 is on the order of 100 mv, it is substantially greater than the voltage level swing (20 mv) on the interconnect lines between the gates. Thus, the internal circuitry of the NOR gate is effectively immune to ground line drops. Moreover, the input impedance is extremely low, thereby increasing noise immunity.

Figure 4:
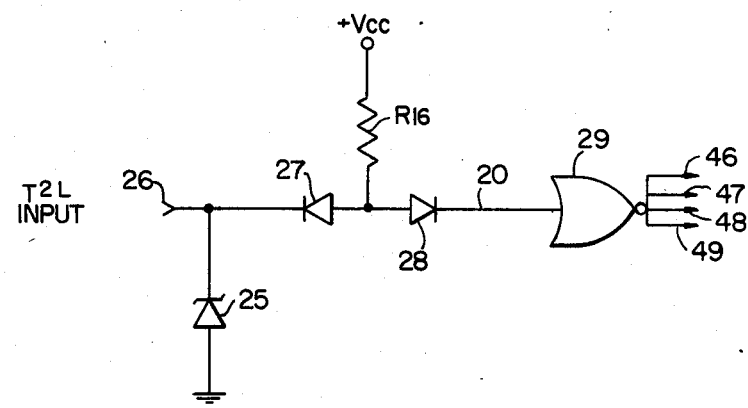
FIG. 4 is a schematic diagram of a circuit for interfacing the output of an upstream $T^2L$ circuit with the input of the NOR gate of FIG. 3.

Because the circuit of FIG. 3 is configured as part of an overall integrated circuit logic function, connections to the external world require an interface circuit. For interconnecting an external input driver such as a T²L input circuit, the circuit of FIG. 4 may be used. As shown therein, an input line 26, which is coupled to the output of T²L driver, is coupled to the cathode of a Schottky diode 25, the anode of which is connected to ground. Limiting diodes 27 and 28 are connected in back-to-back fashion between line 26 and the input 20 of the single input/multiple output NOR gate shown at 29. Bias for the diodes 27 and 28 is supplied through a resistor R16 to positive supply (+VCC) terminal 15.

Figure 5:
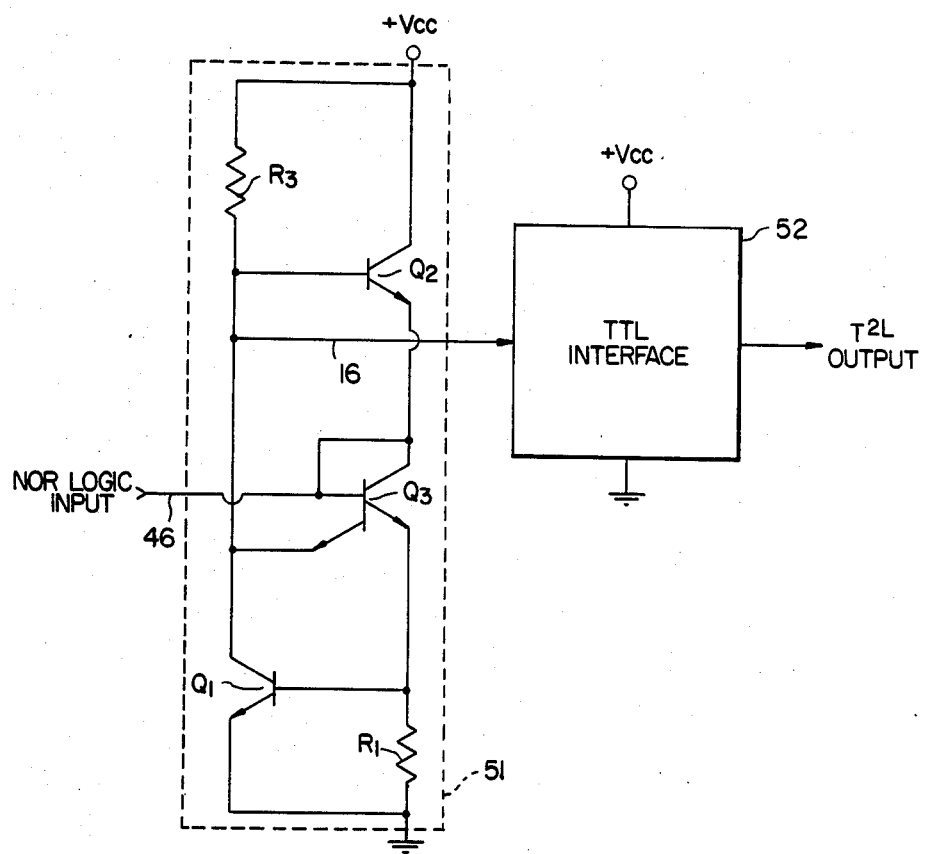
FIG. 5 is a schematic diagram of a circuit for interfacing the output of the NOR gate of FIG. 3 with the input of a downstream $T^2L$ circuit.

For providing an interface to a downstream output circuit, which may be connected to one of the links 46-49 (FIG. 3), a T²L output stage interface circuit such as shown in FIG. 5 may be employed. As shown in FIG. 5, this circuit includes a first stage 51 and a downstream TTL driver stage 52. The input stage is configured essentially the same as the gate shown in FIG. 2 except that the output to the T²L driver stage is connected to the collector of transistor Q1 and there is no control resistor R2 between the emitter of the driver transistor Q2 and the collector node of input transistor Q3. The internal configuration of T²L driver stage 52 is conventional and a description here is not necessary for an understanding of the operation of the present invention. T²L driver stage 52 simply translates the voltage level on line 16 to an output suitable for a downstream T²L output.

As will be appreciated from the foregoing description, the present invention provides a single input/multiple output NOR logic gate which effectively minimizes the logic voltage level swing present on the gate interconnects to an amount that is governed only by changes in $V_{be}$ of a reference voltage source transistor. Because this change in $V_{be}$ is extremely small (governed by a logarithmic characteristic with respect to emitter current) it is typically on the order of less than 20 mv. This extremely low voltage swing prevents the parasitic capacitance that is associated with a gate interconnect links between the logic circuits from having a significant impact on gate switching speed. Internal to the gate itself, however, the voltage swings for the different logic levels are on the order of 100 mv which permits gate-to-gate differences in ground and supply lines to be substantially greater than the logic voltage swing on the gate interconnects. Thus an improved noise immunity and an immunity to an internal ground line drops is provided.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A logic circuit for generating a first output representative of a first prescribed logic level in response to a first prescribed input current and for generating a second output representative of a second prescribed logic level in response to a second prescribed input current comprising:

an input terminal to which one of said first and second prescribed input currents may be applied;

at least one output terminal from which one of said first and second outputs is provided; and means, coupled between said input and output terminals and having a voltage reference source, for establishing and maintaining the voltage level at said input terminal at the voltage provided by said voltage reference source irrespective of the application to said input terminal of either one of said first and second prescribed input currents.

2. A logic circuit according to claim 1, wherein said means includes, as said voltage reference source, a plurality of bipolar transistors, the base-emitter junctions of which are effectively connected in series between a reference terminal and said input terminal.

3. A logic circuit according to claim 1, wherein said means includes a transistor circuit for providing a first current flow path between said input terminal and a reference terminal in response to said first prescribed input current and for providing a second current flow path between said input terminal and said reference terminal in response to said second prescribed input current.

4. A logic circuit according to claim 3, wherein said transistor circuit comprises a plurality of bipolar transistors connected between said input terminal and said reference terminal such that base-emitter junctions thereof are effectively connected in series between said input terminal and said reference terminal, said series-connected base-emitter junctions providing said voltage reference source.

5. A logic circuit according to claim 4, wherein said plurality of bipolar transistors comprises a first transistor, the base-emitter junction of which is connected in parallel with a first prescribed impedance for establishing the current through said impedance as part of said first current flow path in response to said first prescribed input current, and a second transistor, a base-emitter junction of which is coupled between said first impedance and said input terminal.

6. A logic circuit according to claim 5, wherein said second transistor has its base and collector connected to said input terminal, and wherein said transistor circuit further includes means for providing said second current flow path from said input terminal through the collector-emitter path of said first transistor in response to said second prescribed input current being applied to said input terminal.

7. A logic circuit according to claim 6, wherein said second transistor is a multi emitter transistor, a first emitter of which is coupled to said first impedance, and a second emitter of which is coupled to the collector of said first transistor so that said first current flow path is provided by way of the collector-first emitter path of said second transistor and said second current flow path is provided by the collector-second emitter path of said second transistor and the collector-emitter path of said first transistor.

8. A logic circuit according to claim 2, wherein said means includes an output bipolar transistor coupled in circuit between a voltage supply terminal and said input terminal.

9. A logic circuit according to claim 8, wherein said output transistor has its collector-emitter path coupled in series between said voltage supply terminal and said input terminal and its base coupled in circuit with means for providing a prescribed voltage offset relative to said reference terminal.

10. A logic circuit according to claim 9, further including means, coupled between said input terminal and said output transistor, for establishing a prescribed voltage level at the base of said output transistor in response to said first prescribed input current being applied to said input terminal.

11. A logic circuit according to claim 10, wherein said establishing means comprises means for providing a preselected voltage offset at the emitter of said output transistor relative to the voltage level at said input terminal in response to said first prescribed input current being applied to said input terminal.

12. A logic circuit according to claim 11, wherein said establishing means comprises a voltage offset resistor through which a prescribed current, as established by said voltage reference source, flows in response to the application of said first prescribed input current to said input terminal.

13. A logic circuit according to claim 12, wherein the magnitude of said preselected voltage offset is substantially greater than any differential in the voltage present at said input terminal as a result of the successive application of said first and second input currents thereto.

14. A logic circuit according to claim 9, wherein said prescribed voltage offset providing means comprises a voltage offset control bipolar transistor and a diode coupled in series between the base of said output transistor and the collector of one of said plurality of transistors of said voltage reference source.

15. A logic circuit according to claim 14, wherein said voltage offset control transistor has its collector-emitter path coupled between the base of said output transistor and said diode and its base coupled to a voltage divider circuit one end of which is coupled to a voltage supply terminal and the other end of which is coupled to the base of said output transistor.

16. A logic circuit according to claim 15, wherein said voltage divider circuit includes an impedance coupled between the base and collector of said voltage offset control transistor for providing, in response to the application of said second prescribed input current to said input terminal, a voltage drop thereacross that is substantially greater than any differential in the voltage present at said input terminal as a result of the successive application of said first and second prescribed input currents thereto.

17. A logic circuit according to claim 8, wherein said output bipolar transistor comprises a multi-emitter transistor, selected emitters of which are coupled to respective output terminals from each of which one of said first and second outputs are provided.

18. For use in a logic circuit having a plurality of logic devices interconnected with one another by signal interconnection links to perform at least one composite logical operation, a logic device to be incorporated into said logic circuit, as at least one of said logic devices, for effectively minimizing a voltage swing on an interconnection link to which said logic device is coupled, said logic device comprising:

an input terminal, interconnected with said interconnection link, for receiving therefrom one of a first prescribed input current associated with a first prescribed logic state and a second prescribed input current associated with a second prescribed logic state;

at least one output terminal from which said logic device provides a first output representative of said first prescribed logic state in response to said input terminal receiving said second prescribed input current, and a second output representative of said second prescribed logic state in response to said input terminal receiving said first prescribed input current; and means, coupled between said input and output terminals and having a voltage reference source, for establishing and maintaining the voltage level at said input terminal, and thereby on said interconnection link, at the voltage provided by said voltage reference source irrespective of the application to said input terminal of either one of said first and second prescribed input currents.

19. A logic device according to claim 18, further including means, coupled between said input and output terminals, for establishing a prescribed voltage differential within said device, between said first and second prescribed logic states, that is substantially greater than any voltage swing at said input terminal as a result of the successive application of said first and second prescribed input currents thereto.

20. A logic device according to claim 19, wherein said prescribed voltage differential is approximately an order of magnitude as great as said voltage swing.

21. A logic device according to claim 18, wherein said means includes, as said voltage reference source, a series connection of the base-emitter junctions of a plurality of bipolar transistors coupled in series between said input terminal and a reference terminal.

22. A logic device according to claim 21, wherein said plurality of transistors form a transistor circuit connected between said input terminal and said reference terminal so as to provide a first current flow path between said input terminal and said reference terminal in response to said first prescribed input current and provide a second current flow path between said input terminal and said reference terminal in response to said second prescribed input current.

23. A logic device according to claim 22, wherein said plurality of transistors comprises a first transistor, the base-emitter junction of which is connected in parallel with a first prescribed impedance for establishing the current through said impedance as part of said first current flow path in response to said first prescribed input current, and a second transistor, a base-emitter junction of which is coupled between said first impedance and said input terminal.

24. A logic device according to claim 23, wherein said second transistor has its base and collector connected to said input terminal, and wherein said transistor circuit further includes means for providing said second current flow path from said input terminal through the collector-emitter path of said first transistor in response to said second prescribed input current being applied to said input terminal.

25. A logic device according to claim 24, wherein said second transistor is a multi-emitter transistor, a first emitter of which is coupled to said first impedance, and a second emitter of which is coupled to the collector of said first transistor so that said first current flow path is provided by way of the collector-first emitter path of said second transistor and said second current flow path is provided by the collector-second emitter path of said second transistor and the collector-emitter path of said first transistor.

26. A logic device according to claim 21, wherein said means includes an output bipolar transistor coupled in circuit between a voltage supply terminal and said input terminal.

27. A logic device according to claim 26, wherein said output transistor has its collector-emitter path coupled in series between said voltage supply terminal and said input-terminal and its base coupled in circuit with means for providing a prescribed voltage offset relative to said reference terminal.

28. A logic device according to claim 27, wherein said prescribed voltage offset providing means comprises a voltage offset control bipolar transistor and a diode coupled in series between the base of said output transistor and the collector of one of said plurality of transistors of said voltage reference source.

29. A logic device according to claim 28, wherein said voltage offset control transistor has its collector-emitter path coupled between the base of said output transistor and said diode and its base coupled to a voltage divider circuit one end of which is coupled to a voltage supply terminal and the other end of which is coupled to the base of said output transistor.

30. A logic device according to claim 26, wherein said output transistor comprises a multi-emitter transistor, selected emitters of which are coupled to respective output terminals from each of which one of said first and second outputs are provided.

31. A logic device according to claim 27, further including means, coupled between said input terminal and said output transistor, for establishing a prescribed voltage level at the base of said output transistor in response to said first prescribed input current being applied to said input terminal.

32. A logic device according to claim 31, wherein said establishing means comprises means for providing a preselected voltage offset at the emitter of said output transistor relative to the voltage level at said input terminal in response to said first prescribed input current being applied to said input terminal.

33. A logic device according to claim 32, wherein said establishing means comprises a voltage offset resistor through which a prescribed current, as established by said voltage reference source, flows in response to the application of said first prescribed input current to said input terminal.

34. A logic device according to claim 33, wherein the magnitude of said preselected voltage offset is substantially greater than any differential in the voltage present at said input terminal as a result of the successive application of said first and second input currents thereto.

35. For use with a logic circuit having a plurality of logic devices interconnected with one another by signal interconnection links so as to perform at least one composite logical operation, at least one of said logic devices having an input terminal coupled to an interconnection link for receiving therefrom one of a first prescribed input current associated with a first prescribed logic state and a second prescribed input current associated with a second prescribed logic state, and at least one output terminal from which said logic device provides a first output representative of said first prescribed logic state in response to said input terminal receiving said second prescribed input current, and a second output representative of said second prescribed logic state in response to said input terminal receiving said first prescribed input current, a method of effectively minimizing a voltage swing on said interconnection link and thereby increasing the speed at which capacitance associated with said interconnection link is charged and discharged in the course of transitions between said first and second logic states, said method comprising the steps of:

applying to said interconnection link a voltage level corresponding to the voltage provided by a voltage reference source coupled to said input terminal; and maintaining the voltage level on said interconnection link at the voltage provided by a voltage reference source coupled to said input terminal irrespective of which of said first and second prescribed input currents is applied to said input terminal.

36. A method according to claim 35, further including the step of establishing a prescribed voltage differential within said device, between said first and second prescribed logic states, that is substantially greater than any voltage swing at said input terminal as a result of the successive application thereto of said first and second prescribed input currents.

37. A method according to claim 36, wherein said prescribed voltage differential is approximately an order of magnitude as great as said voltage swing.

38. A method according to claim 35, wherein said voltage reference source is provided by the sum of the forward base-emitter voltage drops across the base-emitter junctions of a plurality of bipolar transistors coupled in series between said input terminal and said reference terminal.

39. A method according to claim 38, wherein said plurality of transistors form a transistor circuit connected between said input terminal and said reference terminal so as to provide a first current flow path between said input terminal and said reference terminal in response to said first prescribed input current and provide a second current flow path between said input terminal and said reference terminal in response to said second prescribed input current.

40. A method according to claim 39, wherein said plurality of transistors comprises a first transistor, the base-emitter junction of which is connected in parallel with a first prescribed impedance for establishing the current through said impedance as part of said first current flow path in response to said first prescribed input current, and a second transistor, a base-emitter junction of which is coupled between said first impedance and said input terminal.

41. A method according to claim 40, wherein said second transistor has its base and collector connected to said input terminal, and wherein said transistor circuit further includes means for providing said second current flow path from said input terminal through the collector-emitter path of said first transistor in response to said second prescribed input current being applied to said input terminal.

42. A method according to claim 41, wherein said second transistor is a multi-emitter transistor, a first emitter of which is coupled to said first impedance, and a second emitter of which is coupled to the collector of said first transistor so that said first current flow path is provided by way of the collector-first emitter path of said second transistor and said second current flow path is provided by the collector-second emitter path of said second transistor and the collector-emitter path of said first transistor.

43. A method according to claim 42, wherein said logic device includes an output bipolar transistor coupled in circuit between a voltage supply terminal and said input terminal.

44. A method according to claim 43, wherein said output transistor has its collector-emitter path coupled in series between said voltage supply terminal and said input-terminal and its base coupled to receive a prescribed voltage offset relative to said reference terminal.

45. A method according to claim 44, further including the step of establishing a prescribed voltage level at the base of said output transistor in response to said first prescribed input current being applied to said input terminal.

46. A method according to claim 45, wherein said establishing step comprises the step of providing a preselected voltage offset at the emitter of said output transistor relative to the voltage level at said input terminal in response to said first prescribed input current being applied to said input terminal.

47. A method according to claim 46, wherein the magnitude of said preselected voltage offset is substantially greater than any differential in the voltage present at said input terminal as a result of the successive application of said first and second input currents thereto.

48. A method according to claim 44, wherein said prescribed voltage offset is generated by the step of coupling a voltage offset control bipolar transistor and a diode coupled in series between the base of said output transistor and the collector of one of said plurality of transistors of said voltage reference source.

49. A method according to claim 48, wherein said voltage offset control transistor has its collector-emitter path coupled between the base of said output transistor and said diode and its base coupled to a voltage divider circuit one end of which is coupled to a voltage supply terminal and the other end of which is coupled to the base of said output transistor.

50. A method according to claim 49, wherein said voltage circuit includes an impedance coupled between the base and collector of said voltage offset control transistor for providing, in response to the application of said prescribed input current to said input terminal, a voltage drop thereacross that is substantially greater than any differential in the voltage present on said interconnection link as a result of the successive application of said first and second prescribed input currents thereto.

* * * * *